United States Patent [19]
Holtzberg et al.

[11] 3,972,035
[45] July 27, 1976

[54] DETECTION OF MAGNETIC DOMAINS BY TUNNEL JUNCTIONS

[75] Inventors: Frederic Holtzberg, Pound Ridge; Ashok F. Mayadas, Somers; William A. Thompson, Yorktown Heights; Stephan von Molnar, Ossining, all of N.Y.

[73] Assignee: International Business Machines Corporation, Armonk, N.Y.

[22] Filed: Apr. 2, 1974

[21] Appl. No.: 457,324

Related U.S. Application Data

[62] Division of Ser. No. 265,943, June 23, 1972, Pat. No. 3,840,865.

[52] U.S. Cl. .............................. 340/174 TF; 357/4; 357/12; 357/27; 357/61
[51] Int. Cl.² .................................... G11C 11/14
[58] Field of Search ............... 340/174 TF, 174 EB; 357/27, 4, 5

[56] References Cited
UNITED STATES PATENTS

| | | | |
|---|---|---|---|
| 3,229,172 | 1/1966 | Esaki | 357/27 |
| 3,370,210 | 2/1968 | Fiske | 357/27 |
| 3,541,400 | 11/1970 | Esaki et al. | 357/5 |
| 3,544,865 | 12/1970 | Holtzberg et al. | 357/27 |
| 3,656,029 | 4/1972 | Ahn et al. | 357/4 |
| 3,702,991 | 11/1972 | Bate et al. | 340/174 TF |
| 3,818,328 | 6/1974 | Zinn | 357/27 |
| 3,836,993 | 9/1974 | Joshi | 357/27 |

*Primary Examiner*—James W. Moffitt
*Attorney, Agent, or Firm*—Jackson E. Stanland

[57] ABSTRACT

Tunnel junctions are used to detect magnetic domains, such as bubble domains, using the change in Fermi level of one (or both) electrodes due to the magnetic field of the domain. The Fermi level shift causes the tunnel barrier height to change, leading to a change in tunneling conductance which is detectable as a current or voltage change. A simple tunnel junction in flux coupling proximity to the magnetic domains is suitable, but more sensitive detectors are made using Schottky barrier junctions, and magnetic semiconductors which exhibit conduction band splitting due to the stray field of the domains. In another embodiment, the magnetic sheet supporting the domains provides the tunnel barrier for sensing of the domains within it. Detection of submicron domains is easily achieved.

8 Claims, 16 Drawing Figures

DETECTION OF MAGNETIC DOMAINS BY TUNNEL JUNCTIONS

This division, of application Ser. No. 265,943 filed 6/23/62 now U.S. Pat. No. 3,840,865.

BACKGROUND OF THE INVENTION

1. Field of the Invention

This invention relates to sensing devices for detection of magnetic (bubble) domains and more particularly to a sensing means using tunnel junctions for detection of magnetic bubble domains.

2. Description of the Prior Art

Many sensing techniques are known for detection of magnetic bubble domains. These detection means generally rely upon the influence on the detecting element of the stray magnetic field due to the bubble domain. For instance, a sense loop comprising a conductor is shown for detection of domains in U.S. Pat. No. 3,460,116. The change in magnetic flux linking the sense conductor while a domain passes below it provides the output signal in a known way.

Another type of bubble domain sensing is that using magneto-optic readout, as shown in U.S. Pat. No. 3,515,456. This sensing means relies upon the fact that the bubble domains have magnetization which is opposite to that of the rest of the magnetic sheet. Consequently, the polarization of an input light beam will be rotated differently when the beam passes through a bubble domain than when it passes through the rest of the magnetic sheet. This is the wellknown Kerr effect (reflection) or Faraday effect (transmission).

A four terminal sensor for magnetic bubble domains using the Hall effect is shown in U.S. Pat. No. 3,609,720. This type of sensing requires additional input leads and will not detect ultra-small domains.

The most suitable bubble domain sensing technique discovered so far is that due to magnetoresistive effects. A magnetoresistive element is located in flux coupling proximity to a magnetic domain. When the stray field of the domain intercepts the sensing element, the resistance of the element will change and this is detected as either a current or a voltage change. This type of sensing offers the advantages of easy fabrication, integration into the propagation circuitry used to move the domains, and high signal-to-noise ratios. Magnetoresistive sensing is described in more detail in an article by G. S. Almasi et al, appearing in the Journal of Applied Physics, Vol. 42, P. 1268, 1971.

As the development of magnetic bubble domain technology continues, the size of the domains is decreasing in order to increase storage density. This means that the magnetic field associated with the domains is becoming very small and detection of such domains is difficult. For instance, detection of submicron domains is a future problem which may be limiting in the design of a very high density bubble domain systems. The prior art has not addressed the detection of very small domains, except for various schemes which have been presented using magnetoresistive sensing. For instance, one such scheme involves the use of a second magnetoresistive sensor, series-connected with the first sensor, which is not in flux coupling proximity to the bubble domain. Noise compensation is achieved by this scheme in order to enhance the signal from the domain to be sensed. This noise cancellation means is shown in copending application Ser. No. 192,547 filed Oct. 26, 1971 now U.S. Pat. No. 3,736,419.

Another magnetoresistive sensing scheme designed to detect small bubble domains is that in which the uniaxial anisotropy field and shape anisotropy field are at right angles with one another, the smaller of these fields being aligned with the direction of the magnetic field from the domain. Such a detection means is described in copending application Ser. No. 193,904 filed Oct. 26, 1971 now U.S. Pat. No. 3,716,781.

In order to provide a magnetic domain sensing device having significantly increased sensitivity for detection of very small domains, applicants have discovered that tunnel junctions provide especially sensitive detectors of the stray magnetic field of the domain. This effect is enhanced when magnetic semiconductors and Schottky barrier junctions are used. Further advantages are achieved in that the structure is easily fabricated on the magnetic sheet or in close proximity to the magnetic sheet in which the domains exist, and can be provided in very dense arrays. In particular, magnetic bubble domains are easily sensed, regardless of their size.

Accordingly, it is a primary object of this invention to provide an ultra-sensitive detector of magnetic domains.

It is another object of this invention to provide a sensing device for detection of magnetic bubble domains which have sub-micron diameters.

It is still another object of this invention to provide a sensing means for detection of magnetic domains which does not rely upon a first order effect.

It is a further object of this invention to provide an ultra-sensitive detector of bubble domains which is easily fabricated as a very small detector.

It is a still further object of this invention to provide an improved sensing apparatus for detection of magnetic bubble domains which is capable of high packing densities for use in high density bubble domain systems.

It is another object of this invention to provide a sensing means for detection of magnetic bubble domains which comprises the magnetic sheet in which the domains exist.

SUMMARY OF THE INVENTION

A magnetic sheet is provided in which the domains exist. Domains can be nucleated and collapsed within the sheet and can also be propagated in the sheet by known means. For instance, a permalloy pattern provides discrete magnetic poles for movement of the domains in response to a reorienting magnetic field within the plane of the magnetic sheet. Another known propagation means uses conductor loops to provide a magnetic field gradient, while still another known propagation means uses permalloy wedges in conjunction with a modulating bias field to move domains.

The sensing means comprises a tunnel junction located sufficiently close to the magnetic sheet that the stray magnetic field from the bubble domains will intercept the junction. When a magnetic field intercepts the tunnel junction, the Fermi level of one or both electrodes to the junction will shift causing the tunnel barrier height to change. This leads to a change in tunnel junction resistance which can be detected as a current or voltage change indicating the presence and absence of a magnetic bubble domain. Any type of tunneling is suitable for the practice of this invention.

Electrical means are provided for establishing a tunnel current through the tunnel junction. This electrical means can be either a current or voltage source, and is preferably a constant current source or a constant voltage source. If a constant current source is used, the change in tunneling resistance of the junction will be indicated as a voltage signal, while if a constant voltage source is used, the change in tunnel junction resistance will be indicated as a current pulse.

Means is provided which is responsive to the change in tunnel junction resistance for detection of the presence and absence of magnetic bubble domains in flux coupling proximity to the tunnel junction. If desired, a sense amplifier can be provided to amplify the current or voltage pulse received from the sensing apparatus. A utilization means, such as any known circuitry, is provided for using the output current or voltage pulses as information pulses indicative of the presence and absence of magnetic bubble domains.

The tunnel junction can be comprised of a normal insulating tunnel barrier, or can be a Schottky barrier or double Schottky barrier. Use of the Schottky barrier and double Schottky barrier provides an additional sensitivity for detection of sub-micron domains, since both the barrier height and barrier width change depending upon the magnetic field intercepting the junction. Another useful embodiment employs a magnetic semiconductor material whose conduction band undergoes splitting when the magnetic semiconductor has a temperature close to its Curie point temperature. If the Fermi level is of the same order as the amount of conduction band splitting which occurs, a very large effect will be achieved and the sensitivity of the detector will be enhanced.

Another embodiment uses a magnetic insulator to provide the tunnel barrier. In this case, it is suitable to attach electrodes to the magnetic sheet in which the domains exist and to use the tunnel junction formed between one of the electrodes (or both) and the magnetic sheet as the detector of domains in the sheet. This embodiment then uses the magnetic sheet itself as part of the detection apparatus for sensing of domains within the magnetic sheet.

As will be more fully apparent later, various structures can be provided for each of these embodiments. For instance, a metal-semiconductor structure, a semiconductor-semiconductor structure, a semiconductor-insulator-semiconductor structure, and a metal-insulator-semiconductor structure can be employed. While some of these structures have the advantage of enhanced sensitivity to very small magnetic bubble domains, they are all characterized in that the tunnel junction resistance of these structures undergoes a change when a magnetic bubble domain is located in flux coupling proximity to the junction. While this description has been presented in terms of magnetic bubble domains, other types of magnetic domains can be detected also.

These and other objects, features, and advantages will be more apparent in the following more particular description of the preferred embodiments.

BRIEF DESCRIPTION OF THE DRAWINGS

FIG. 9A shows a semiconductor-semiconductor tunnel barrier for detection of magnetic domains, while

FIG. 10A shows a semiconductor-insulator-semiconductor tunnel barrier for detection of magnetic bubble domains, while

DETAILED DESCRIPTION OF THE PREFERRED EMBODIMENTS

Figure 1:
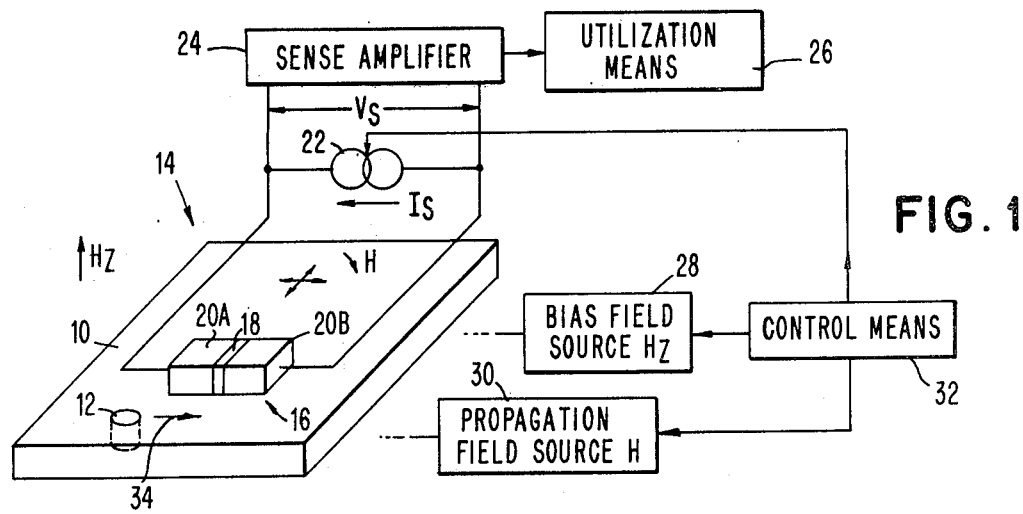
FIG. 1 is a schematic view of a tunnel junction sensing device for detection of magnetic bubble domains.

FIG. 1 is a schematic diagram of a sensing apparatus for detection of magnetic domains using a tunnel junction. While it is illustrated for use as a detector of magnetic bubble domains, it should be understood that any type of magnetic domain can be detected in this manner. For instance, this type of apparatus can be used to detect domain tips or so-called permalloy domains, which have their magnetization in the plane of the permalloy sheet in which they exist.

Further, this apparatus is useful for detection of domains as they are used in magnetic recording art. For example, the magnetic sheet 10 (FIG. 1) can be a magnetic disc or tape and the domains 12 can be conventional magnetic domains normally used in these media.

In FIG. 1 and in the other figures, the same reference numerals will be used whenever possible to provide ease of reading.

A magnetic sheet 10 is provided in which the bubble domains 12 exist and can be propagated and nucleated. The magnetic sheet 10 can be any known materials such as garnet films, orthoferrite films, or magnetoplumbite films. Domains 12 are characterized by having a magnetization vector normal to the plane of magnetic sheet 10 and oppositely directed to the magnetization vector of sheet 10. The domains are further characterized by having a single wall unbounded by the magnetic sheet in which they exist. These domains can be nucleated at desired locations in magnetic sheet 10 (as for instance, using the means shown in U.S. Pat. No.

3,662,359) and can be propagated in magnetic sheet 10.

Located in proximity to sheet 10 is the bubble domain sensing device generally indicated by the numeral 14. Sensor 14 is comprised of a sensing element 16 which has a tunnel barrier 18 therein. Means 20A and 20B provide current carrying connections to tunnel barrier 18.

An electrical means, herein shown as current source 22, provides a measuring current $I_s$ through sensing element 16. Preferably, current source 22 is a constant current source. The voltage signal $V_s$ which develops across sensing element 16 when domains are detected by element 16 is applied to sense amplifier 24. After amplification by amplifier 24, the electrical signals are sent to a utilization means 26, which can be any circuit using the information represented by the presence and absence of bubble domains in sheet 10.

Bias field source 28 provides the magnetic bias field $H_z$ normal to magnetic sheet 10, as is conventionally well known. This source 28 can be either a coil surrounding sheet 10 or a permanent magnet located in proximity to sheet 10. In addition, it can be a magnetic film exchange coupled to sheet 10, as is known in the art.

Propagation field source 30 provides a magnetic field H which is in the plane of magnetic sheet 10 and is used to provide domain propagation in sheet 10. Field H is a reorienting magnetic field which is used in a known way. Control means 32 provides clock signals to bias field source 28 and propagation field source 30, as well as to current source 22 to trigger the operation of these various sources. For instance, under control of means 32, electrical means 22 will provide a current pulse at the appropriate time the presence and absence of a domain is to be sensed by element 16.

In operation, domains 12 are propagating along the direction indicated by arrow 34 so that they are in flux coupling proximity to sensing element 16. Of course, the domains 12 could be nucleated and collapsed in the proximity of element 16 rather than being propagated therepast. In fact, sensing element 16 is sensitive to the flux from domains 12, and the domain movement (propagation or expansion and collapse) is not required. When the stray magnetic field of the domain intercepts tunnel barrier 18, the tunneling resistance of element 16 changes. This creates a change in voltage across element 16 (if the constant current $I_s$ is used) which is detected as a voltage signal $V_s$. If a constant voltage source is used, there will be a current change through element 16 when domains are present in flux coupling proximity to element 16. In this case, a current pulse will be sensed and applied to amplifier 24.

Figure 2:
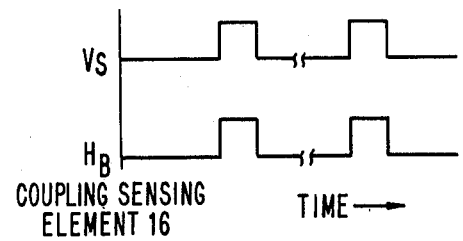
FIG. 2 is a plot of voltage output $V_s$ and magnetic field $H_B$ coupling the sensing element, measured against time.

FIG. 2 illustrates the operation of sensing apparatus 14. The magnetic field $N_B$ emanating from domain 12 and coupling sensing element 16 is plotted versus time, and the voltage signal $V_s$ across element 16 is also plotted against time. From these plots, it is evident that when the magnetic field of a domain couples sensing element 16, a voltage output voltage $V_s$ will be produced. This output pulse will have a duration depending on the duration of the magnetic field coupling element 16. When the magnetic field from the domains no longer couples element 16, voltage $V_s$ will diminish to its value in the absence of a coupling magnetic field.

PHYSICS OF SENSING APPARATUS 14

This section is concerned with the physics by which the effect of the stray magnetic field of the bubble domains is detected as an indication of the presence and absence of the domains. This is a surface barrier effect having to do with a Fermi level shift in at least one of the conductors 20A or 20B. A tunnel junction is provided for detection of the Fermi level shift due to applied magnetic fields and this shift causes a change in tunnel barrier height of the tunnel junction. This is a non-linear effect which leads to very large sensitivities to stray magnetic fields of very small magnitude. Therefore, detection of very small bubble domains is possible, in contrast with the limitations of the prior art sensing apparatus.

Figures 3A, 3B:
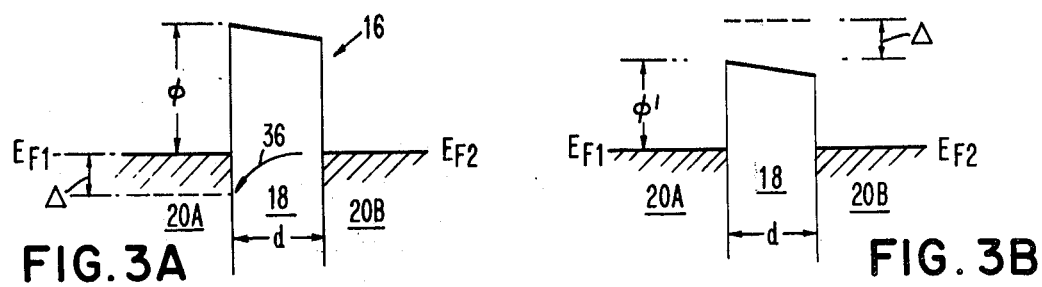
FIGS. 3A and 3B are energy band diagrams for a tunnel junction showing the effect of a magnetic field on the barrier height of the junction.

FIGS. 3A and 3B show energy level diagrams for a sensing element 16 comprising a conductor 20A—insulator 18—conductor 20B. The tunnel barrier height is $\phi$ and the tunnel barrier width is d. Generally, the tunnel barrier width is the same as the geometrical thickness of insulator 18, although it could be less if surface states exist in insulator 18. The Fermi level of electrons in conductor 20A is given by $E_{F1}$, while the Fermi level in conductor 20B is given by $E_{F2}$.

When a magnetic field $H_B$ from domain 12 intercepts tunnel barrier 18, the Fermi level $E_{F1}$ of conductor 20A shifts downwardly by an amount $\Delta$ with respect to $E_{F2}$. This is an unstable condition which leads to charge transfer from conductor 20B to conductor 20A, as represented by arrow 36. This charge transfer leads to a lowering of the tunnel barrier height so that the new barrier height $\phi'$ is equal to $(\phi-\Delta)$, as shown in FIG. 3B. Thus, the shift in Fermi level of conductor 20A is manifested in a change in the barrier height of the tunnel junction.

The change in barrier height leads to a change in tunnel junction resistance. This is easily seen from the following equation:

$$R \propto e^{\phi^{1/2}d} \tag{1}$$

where
 $R$ = tunnel junction resistance
 $\phi$ = tunnel barrier height
 $d$ = tunnel barrier width. This in turn leads to a change in current (j) through the tunnel junction or voltage (V) across the junction which is proportional to the barrier height and width as represented by the following expressions.

$$j \propto e^{-\phi^{1/2}d} \tag{2}$$

$$V \propto e^{\phi^{1/2}d} \tag{3}$$

Thus, the change in tunnel junction resistance will be manifested as either a current or voltage change, depending upon whether a constant voltage source or a constant current source is used to provide the measuring current $I_s$.

As will be noted from equations 1-3, the shift in Fermi level of sensing element 16 is manifested as a change in the barrier height $\phi$. However, the tunnel junction resistance is an exponential function of the barrier height $\phi$, so that the sensitivity of this sensing apparatus is extremely high. Therefore, detection of very small domains is possible.

FIGS. 4A AND 4B

Figures 4A, 4B:
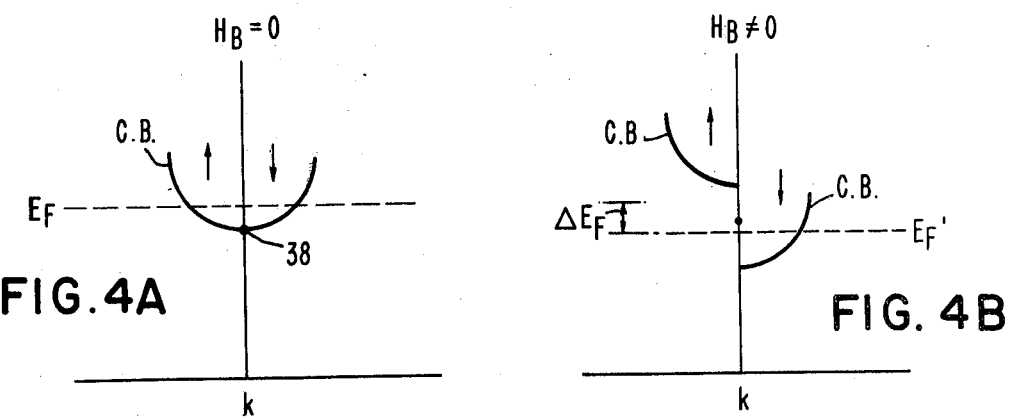
FIGS. 4A and 4B are energy band diagrams for a magnetic semiconductor, illustrating splitting of the conduction band and shift of the Fermi level of such a material when a magnetic field is present.

Whereas FIGS. 3A and 3B showed the energy band diagrams of a conventional insulating tunnel barrier, FIGS. 4A and 4B illustrate the energy band diagrams when the insulator 18 is replaced by a magnetic semiconductor. A magnetic semiconductor is a material which has a spontaneous magnetic moment which is dominated by a barrier height change at temperatures below the Curie temperature $T_c$ of the material. An example is doped EuS and doped $CdCr_2Se$. Single crystals of EuS can be grown having sulfur vancancies in sealed tungsten crucibles by a melt-regrowth technique. Carrier concentrations greater than about $10^{19}$ carriers per cubic centimeter are suitable.

FIG. 4A is an illustration of the energy band level of a magnetic semiconductor when no bubble domain field $H_B$ is present across the semiconductor (i.e., $H_B=0$). The conduction band (CB) is shown, as well as the Fermi level $E_F$ of the material. The Fermi level is measured with respect to the bottom of the conduction band, designated by point 38. The arrows within the conduction band indicate electrons which have spin-up and spin-down.

FIG. 4B illustrates the splitting of the conduction band of the magnetic semiconductor which leads to a shift in Fermi level of the material when a magnetic field $H_B$ exists in the semiconductor material (i.e., $H_B \neq 0$). As is apparent from this diagram, the conduction band for the spin-up electron is shifted upwardly and the conduction band for the spin-down electron is shifted downwardly, each shift being in the same amount. In addition, the new Fermi level $E'_F$ has been shifted downwardly by an amount $\Delta E_F$. Conduction band splitting is proportional to the magnetic field strength and the Pauli-spin vector associated with the electrons. That is, in a flat film configuration with the field along the axis $$E \alpha -B \cdot \sigma \qquad (4)$$

where
$E$ = energy
$B$ = internal magnetic field acting on the electrons in the magnetic semiconductor
$\sigma$ = Pauli-spin vector of the electrons.

$$B = H_B + 4\pi M = (1 + 4\pi |\chi|) H_B \qquad (5)$$

where
$\chi$ = magnetic susceptibility
$H_B$ = magnetic field from bubble domain. The amount of splitting depends on the magnitude of the stray magnetic field of the bubble domain and the magnetic susceptibility $\chi$. Further, $$\chi = dB/dH \; \alpha \; 1/|T-T_c| \qquad (6)$$

where
$T$ = the operating temperature of the magnetic semiconductor
$T_c$ = the Curie temperature of the magnetic semiconductor.

Thus, it is apparent that when a magnetic semiconductor is used the conduction band splitting leads to large changes in the barrier height $\phi$ of the material, especially if the material is operated at a temperature $T$ close to the Curie temperature $T_c$. As is apparent from equation 6, this will maximize the value of $\chi$.

For maximum sensitivity, the Fermi level of the magnetic semiconductor is of the same order as the amount of splitting which occurs, or is less. Since the change in barrier height of the material is a function of the Fermi level shift, maximum sensitivity ($\Delta\phi/\phi$) is achieved when the value of the Fermi level $E_F$ in the absence of a magnetic field $H_B$ is approximately equal to the shift in conduction band of the material when a magnetic field $H_B$ is present.

FIG. 5

In addition to the dramatic increase in sensitivity which results when a magnetic semiconductor is used, the detector sensitivity is also increased when a Schottky barrier is used in sensing element 16. Of course, the Schottky barrier can be constructed using a magnetic semiconductor which will provide still further enhancement of sensitivity.

Figure 5:
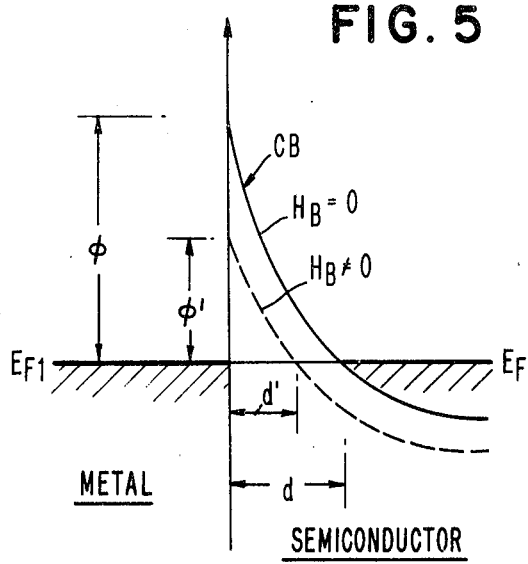
FIG. 5 is an energy band diagram of a Schottky barrier, illustrating the shift of the conduction band of the barrier due to the presence of a magnetic field from a bubble domain.

FIG. 5 shows the energy band diagram for a Shottky barrier, which is comprised of a metal-semiconductor structure. The conduction band CB of the semiconductor is shown, as well as the Fermi levels $E_{F1}$ (metal) and $E_{F2}$ (semiconductor). Normally, electrons are filled up to the levels $E_{F1}$ and $E_{F2}$. The tunnel barrier width d of a Schottky barrier is not a fixed distance dependent upon the thickness of a dielectric, but rather is a distance which is determined by the barrier height, dielectric constant of the material, and donor concentration in the semiconductor. This distance changes with doping in the semiconductor, as is well known.

When no magnetic field from a bubble domain intercepts the Schottky barrier, the conduction band of the semiconductor is shown by the solid line ($H_B=0$) and the barrier height of the junction is $\phi$. However, when the stray field of a domain intercepts the barrier, the conduction band in the semiconductor shifts downwardly as indicated by the dashed line ($H_B \neq 0$). This leads to a change in barrier height to a new value $\phi'$ and, in addition, leads to a change in the barrier width to a new value $d' < d$. Consequently, a Schottky barrier undergoes not only a change in barrier height, but a change in barrier width, thereby leading to a further sensitivity, which can be appreciated by reference to equations 1-3.

In more detail, the barrier width d (tunneling distance) in a Schottky barrier is given by the following expression $$d \sim \sqrt{\phi\epsilon/N} \qquad (7)$$

where
$\phi$ = barrier height
$\epsilon$ = relative dielectric constant of the semiconductor
$N$ = donor concentration in the semiconductor.
When equation 7 is placed in equation 1, it is readily apparent that the tunnel junction resistance now changes proportionally to $e^\phi$ rather than $e^{\phi 1/2}$. Hence, a greater change in current or voltage in the junction occurs when a Schottky barrier is used as a detector element.

FIG. 6

In addition to the use of normal insulators, magnetic semiconductors, and Schottky barriers, it is also possible to use a magnetic insulator for the tunnel barrier material 18. The magnetic insulator may be chosen from many materials, for instance undoped EuS or EuO, or yttrium-based garnet systems such as $Gd_{3-y}Y_y$-$Fe_xGa_{4-x}O_{12}$. These materials generally have doping levels less than about $10^{18}$ carriers per cubic centimeter.

Figure 6:
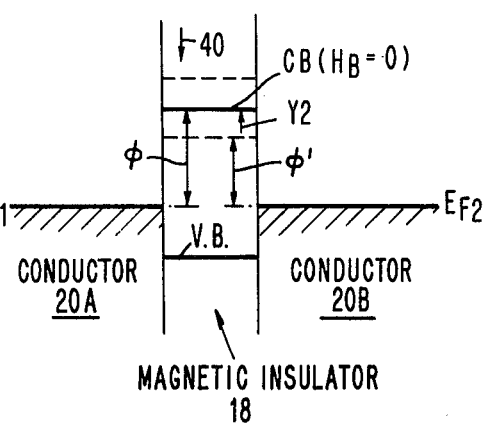
FIG. 6 is an energy band diagram of a structure utilizing a magnetic insulator as a tunnel barrier, illustrating the splitting of the conduction band of the magnetic insulator when a magnetic field is present in the insulator.

In FIG. 6, the conduction band when no magnetic field from a domain is present ($H_B=0$) is shown as a solid line while the conduction band splitting which occurs when $H_B \neq 0$) is shown by the dashed lines. The top-most dashed line is for electrons having spin-down as indicated by arrow 40 while the bottom-most dashed line is for electrons having spin-up as indicated by arrow 42. The valence band of magnetic insulator 18 is indicated by solid line $V_B$. The Fermi levels in conductors 20A and 20B are respectively $E_{F1}$ and $E_{F2}$.

As is apparent from FIG. 6, the barrier height $\phi$ ($H_B=0$) changes to a value $\phi'$ when the stray magnetic field of a domain is present in magnetic insulator 18. Thus, conduction band splitting leads to a change in barrier height which causes a change in tunnel junction resistance in accordance with equation 1. Conduction band splitting in material 18 is greater when the operating temperature of magnetic insulator 18 is near its Curie temperature. If the barrier height $\phi$ is of about the same order as the amount of conduction band splitting, a fairly large effect will be obtained, leading to reasonable sensitivity of detection of bubble domains.

The foregoing description has described the effects of a magnetic field on tunnel junction resistance. In all the configurations illustrated, the shift in Fermi level or conduction band splitting is manifested as a change in barrier height which in turn leads to a change in tunnel junction resistance. This tunnel resistance change is not a bulk effect and is not a linear effect. As such it is contrasted in its fundamental physics from effects such as the Hall effect or the magnetoresistive effect.

SENSING ELEMENT CONFIGURATIONS

FIGS. 7-11 show various configurations for the sensing element 16 of FIG. 1. The associated circuitry is not shown in FIGS. 7-11, for ease of drawing. These configurations all provide a tunnel junction whose barrier height is changed due to the magnetic field of the domain being sensed.

Figure 7:
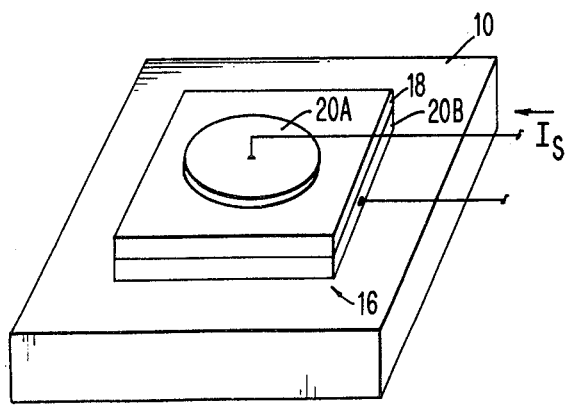
FIG. 7 shows an embodiment for a tunnel junction sensing means for detection of magnetic bubble domains.

In FIG. 7, magnetic sheet 10 has located in proximity thereto the sensing element, 16 having a bottom conductor 20B and a top conductor 20A. Located between these conductors is the material providing the tunnel barrier 18. This can be a conventional insulating material, a magnetic semiconductor, a magnetic insulator or combinations of these, in accordance with the principles described above.

The thickness of tunnel barrier 18 is generally less than about 100 angstroms in order to allow tunneling through barrier 18. If the thickness of barrier 18 is greater than about 100 angstroms, pure tunneling will not result, and conduction between conductors 20A and 20B will occur by other mechanisms, such as hopping, etc. Since the dominant mechanism for detection of domains in the present sensing device concerns the change in tunnel junction resistance, the barrier 18 is preferably made less than about 100 angstroms. However, to the extent that the change in tunnel junction resistance is detectable as an indication of a domain, larger thicknesses of barrier 18 can be used.

The electrode 20A is shown as being smaller than electrode 20B in FIG. 7. This insures that the contact resistance for conductor 20A is less than that of conductor 20B thereby allowing easier control. Consequently, the dominant tunnel resistance change will occur between conductor 20A and barrier 18. As will be understood by those of skill in the art, this detection means will work as intended, even if this is not done.

FIG. 8

Figure 8:
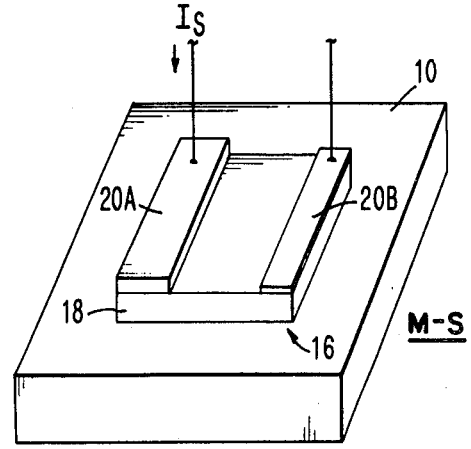
FIG. 8 shows a metal-semiconductor embodiment (Schottky barrier) tunnel junction for detection of magnetic bubble domains.

FIG. 8 shows a metal-semiconductor (M-S) structure which provides a Schottky barrier for detection of domains. Specifically, conductors 20A and 20B are provided for tunnel barriers 18, which is a semiconductor. Further, this could be a magnetic semiconductor as was described with respect to FIGS. 4A and 5. Sensing element 16 is located sufficiently close to magnetic sheet 10 that domains traveling within the sheet will have their magnetic fields intercept the barrier between conductor 20A and semiconductor 18. This element operates in accordance with the principles shown in FIGS. 4A, 4B (magnetic semiconductor), and 5 (Schottky barrier) for detection of domains.

Figure 9A:
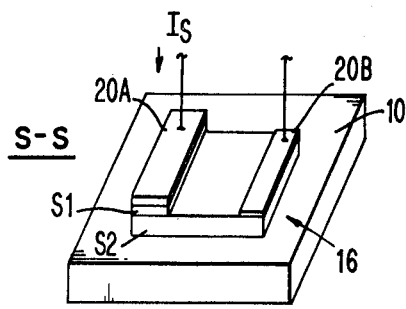
Figure 9B:
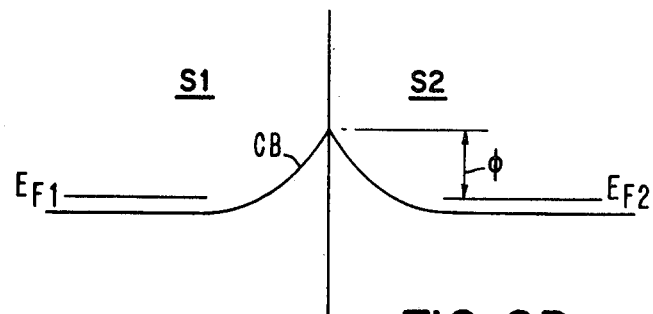
FIG. 9B shows an energy band diagram for the structure of FIG. 9A.

FIGS. 9A and 9B

FIG. 9A shows a semiconductor-semiconductor (S-S) structure which serves as a double Schottky barrier. The energy band diagram of this double barrier is shown in FIG. 9B, where the semiconductors are designated S1 and S2.

In FIG. 9A, conductors 20A and 20B are provided for contact to first semiconductor S1 and second semiconductor S2, respectively. These semiconductors have slightly different doping and an active interface is provided between them. If semiconductors S1 and S2 are the same material, a small tunnel barrier $\phi$ will be obtained, leading to greater sensitivity. In addition, these semiconductors can be magnetic semiconductors. An appropriate doping for the semiconductors is, for instance, S1 doping = $3\times10^{19}$ carriers per cubic centimeter and S2 doping = $10^{19}$ carriers per cubic centimeter. A suitable material for S1 and S2 is EuS.

Since the semiconductor materials are preferably the same, the height $\phi$ of the barrier can be made very small because a small number of surface states will exist. This enhances the Fermi level shift. If the semiconductors are magnetic semiconductors having different doping levels, each semiconductor will have a Fermi level shift which occurs at a different temperature for each semiconductor. Therefore, the Fermi levels will shift at different temperatures leading to separate splittings of the Fermi level for each of the semiconductors.

Figure 10A:
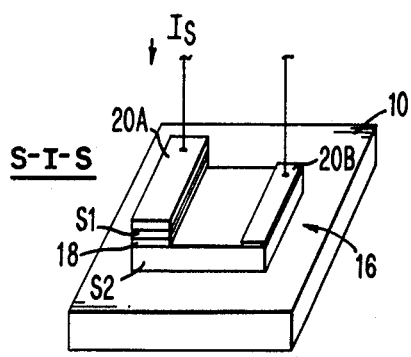
Figure 10B:
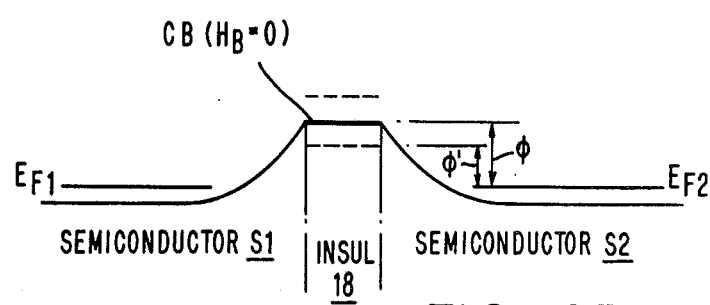
FIG. 10B shows the energy band diagram for the structure of FIG. 10A.

FIGS. 10A and 10B

A semiconductor-insulator-semiconductor (S-I-S) structure is shown in FIG. 10A and its associated energy band diagram is shown in FIG. 10B. This energy band diagram is similar to that (FIG. 9B) of the double Schottky barrier except that in this case a dielectric is provided between the semiconductors S1 and S2.

In FIG. 10A, conductor 20A is provided for passage of current to first semiconductor S1. This semiconductor is located adjacent dielectric 18 which is in turn in contact with second semiconductor S2. Conductor 20B provides current flow from semiconductor S2. Sensing element 16 of FIG. 10A differs from that of FIG. 9A in that the active region here is an insulator, rather than the interface between two semiconductors. The change in tunneling characteristic occurs in the insulator in the embodiment of FIG. 10A. As before, magnetic semiconductors can be used for semiconductors S1 and S2 in order to have a greater effect. However, their use is not necessary to provide a sensitive detector.

Referring to FIG. 10B, the conduction band CB of insulator 18 is shown as a solid line in the absence of a magnetic field $H_B$. The Fermi level of semiconductor S1 is $E_{F1}$, while that of semiconductor S2 is $E_{F2}$. Initially the barrier height is $\phi$. When the magnetic field $H_B$ of a domain is coupled to sensing element 16, the conduction band of insulator 18 splits as shown by the dashed lines. This leads to a new barrier height $\phi' < \phi$. This in turn leads to a change in tunneling junction resistance as explained previously.

FIG. 11

Figure 11:
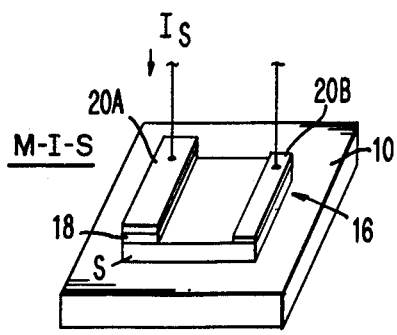
FIG. 11 shows a metal-insulator-semiconductor tunnel barrier for detection of magnetic domains.

FIG. 11 shows a metal-insulator-semiconductor (M-I-S) structure for sensing element 16. This structure is similar to the structure of FIG. 10A, except that a metal is provided adjacent to insulator 18, rather than a semiconductor S1 as was used in FIG. 10A. The sensitivity of the device of FIG. 11 is approximately the same as that of FIG. 10A, and its operation is essentially the same; therefore, it will not be described in detail.

In FIG. 11, conductor 20A provides electrical contact to insulator 18, which is in contact with semiconductor S. Conductor 20B also provides electrical contact to semiconductor S. Of course, semiconductor S can be a magnetic semiconductor if greater sensitivity is desired.

FIG. 12

Figure 12:
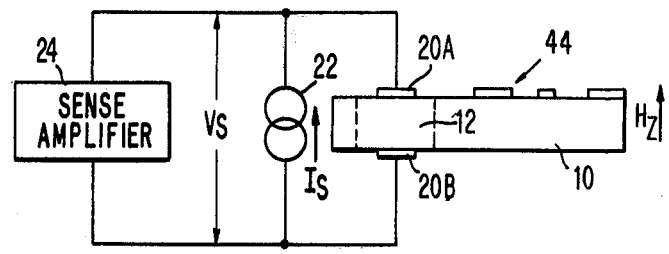
FIG. 12 shows a detector for magnetic bubble domains using the magnetic sheet in which the domains exist for provision of the tunnel barrier.

FIG. 12 shows an embodiment in which a magnetic insulator is used for detection of domains 12. In this case, the magnetic insulator is the magnetic sheet 10 which supports the domains 12. Operation of the device of FIG. 12 is in accordance with the energy band diagram of FIG. 6.

In more detail, magnetic sheet 10 has domains 12 therein which are propagated by propagation means 44, which could be permalloy elements located adjacent magnetic sheet 10 which provide magnetic poles in accordance with the orientation of propagation field H.

Located adjacent to magnetic sheet 10 are conductors 20A and 20B which provide current $I_s$ from electrical means 22 through magnetic sheet 10. Depending upon whether or not a domain 12 is present between conductors 20A and 20B, a voltage level $V_s$ will be developed across magnetic sheet 10. This signal is amplified by amplifier 24 and supplied to a utilization means 27 (not shown here), as was explained with reference to FIG. 1.

The thickness of magnetic sheet 10 is such that tunneling current can occur across it. Generally about 100 angstroms or less is the preferred thickness. As explained with respect to FIG. 6, the presence of a domain 12 in flux coupling proximity to the area of sheet 10 located between conductors 20A and 20B will lead to conduction band splitting in sheet 10. This in turn will lead to a change in barrier height $\phi$ which will be manifested by a voltage $V_s$ if a constant current $I_s$ is provided. Thus, a double domain detector using the magnetic sheet itself as the sensing element is provided.

MATERIALS AND GEOMETRY OF SENSING ELEMENT 16

Many materials can be used to provide sensing element 16 having a tunnel junction therein. For instance, insulators can be used to provide the tunnel barrier 18. These insulators include any dielectric such as oxides and very lightly doped semiconductors. The conductors 20A and 20B are used to provide current to the tunnel barrier and can be comprised of any suitable metal (such as In) and highly doped semiconductors (doping greater than $10^{20}$ carriers per cubic centimeter).

For the embodiments using a semiconductor, doping in the range where degeneracy occurs is generally suitable, but the doping level can vary between $10^{17}$–$10^{21}$ carriers per cubic centimeter depending on the material used, tunneling width, etc. Generally, it is desirable to maximize the tunneling current through the device, to allow easier detection. In addition $\Delta\phi/\phi$ should be as large as possible. Any known semiconductor can be used. If a magnetic semiconductor is desired, suitable examples are EuS and EuO, which can be doped with trivalent rare earth elements or excess Eu to provide a non-stoichiometric composition. In addition, $CdCr_2Se$ is suitable. Doping levels approximately $10^{19}$ carriers per cubic centimeter are generally used.

If desired, a magnetic material can be used for one of the conductors 20A or 20B. For instance, a structure comprising $Al$-$Al_2O_3$-Fe alloy is suitable. For maximum effect, the temperature of the Fe conductor is near its Curie point.

Magnetic insulators are known, such as EuS and EuO which are undoped. Further, garnet materials, such as yttrium-based garnets are suitable magnetic insulators. These materials are generally known as materials suitable for bubble domain sheets, and reference is made to an article by E. A. Giess et al appearing in Materials Research Bulletin, Vol. 6, Pg. 317, May 1971.

In contrast with magnetoresistive sensors, the present sensing apparatus is not geometry dependent. As long as there is a component of the bubble domain field parallel to the magnetic sheet 10, a change in tunnel junction resistance will occur. There is no constraint with respect to the length and width of sensing element 16 and no problems due to demagnetizing fields in sensing element 16. Generally, the size of the element 16 is approximately the diameter of the bubble domain being sensed and the thickness of sensing element 16 is not critical, since the device will work as long as the domain magnetic field intercepts the tunnel barrier.

It is desirable that the thickness of the tunnel barrier 18 be dominant so that a maximum sensitivity will occur. For instance, if the thickness of the magnetic semiconductor is approximately twice the tunnel barrier thickness, the resistance of the tunnel barrier will dominate and the change in tunnel current will be the dominant effect.

EXAMPLE

A Schottky barrier using indium-EuS was prepared for tunneling measurements. Single crystals of EuS having sulfur vacancies were grown in sealed tungsten crucibles by a meltregrowth technique. Tunneling junctions were prepared on this material by vacuum cleaving small crystals in the presence of an evaporating stream of the counter electrode material, indium. Evaporation during cleaving avoids contamination of the barrier interface. The ohmic contact on the reverse side was prepared by diffusing a lanthanum-silver alloy into the crystal.

In this semiconducting ferromagnetic system, the Curie temperature $T_c$ increases rapidly as a function of carrier concentration, due to strong indirect exchange between the impurity electron and the localized 4f states which lie in the bandgap.

Tunneling measurements were made possible by reducing the thickness d of the EuS Schottky depletion barrier sufficiently so that direct tunneling predominated. The thickness is proportional to the square root of the barrier height $\phi$ and inverse carrier concentration $1/N$, and is sufficiently thin for tunneling at concentrations greater than $10^{19}$ carriers per cubic centimeter, when the counter electrode is indium.

When the localized Eu spins begin to order the conduction band is split by the Weiss molecular field. This splitting is of the order of 0.25–3 volts. The band splitting by spin ordering occurs before Fermi level realignment. Since the splitting in this sample was many times the degenerate semiconductor Fermi level of <0.05 volts, the conduction band becomes spin polarized below $T_c$. Realignment of the Fermi levels of the indium electrode and the semiconductor region occurs through the charge transfer of electrons from indium to the semiconductor. At this time the Schottky potential barrier voltage V becomes smaller by $\frac{1}{2} g\mu H_{Weiss}$ where $g$ is the gyromagnetic ratio, $\mu$ is the Bohr magneton, and $H_{Weiss}$ is the molecular field. The change in potential barrier is monitored in this experiment by measuring the zero-bias tunneling conductance which is an exponential function of the barrier height $\phi$. The fractional change in barrier height is directly proportional to the fractional change in spontaneous magnetic moment of the material.

What has been described is a very accurate sensing device for detection of magnetic fields from magnetic domains of any type. The device is particularly suitable for detection of magnetic bubble domains and especially those domains which have sub-micron diameters. The sensing apparatus operates on the principle of detection of a change in Fermi level of an electrode by detecting the change in tunneling barrier height and its corresponding effect on the magnitude of the tunneling junction resistance.

Many materials can be used which are conventionally well known in the art. The semiconductors used are known, as are the magnetic semiconductors, magnetic insulators, and metallic conductors.

As opposed to the linear effects previously and for sensing, this sensing apparatus relies upon a non-linear effect allowing increased sensitivity to the magnetic field of the domains. It is an effect which is a surface effect rather than an effect in the bulk of the material so that the thicknesses used generally are quite variable. The important distance is the tunneling width, rather than the physical width of the various media. Also, the plane of the tunnel barrier can be at any angle to the plane of the magnetic sheet supporting the domains, and the thickness of the films as deposited on the magnetic sheet is substantially arbitrary as long as the magnetic field of the domain intercepts the tunnel barrier. Further, it is feasible to use the magnetic sheet supporting the domains as the tunnel barrier material itself, thereby providing a structure which serves as its own sensing apparatus.

What is claimed is:

1. A magnetic bubble domain device, comprising:
   a magnetic medium in which said bubble domains exist,
   a sensing device for detection of said bubble domains, said sensing device including a tunnel junction whose tunneling resistance depends on the presence and absence of a domain sufficiently close to said sensing device that a stray magnetic field associated with said domain will intercept said tunnel junction, said tunnel junction being comprised of a magnetic insulator tunnel barrier having magnetic bubble domains therein which are sensed by said sensing device,
   means for producing a tunneling current through said tunnel junction,
   means for sensing the change in tunnel resistance of said tunnel junction for detection of said magnetic bubble domain.

2. A magnetic bubble domain sensor for detection of magnetic bubble domains in a magnetic medium, comprising:
   first and second electrodes having a magnetic semiconductor in contact therewith and including a tunnel junction whose tunneling resistance depends on the presence and absence of a magnetic bubble domain sufficiently close to said sensor that the stray magnetic field associated with said domain will intercept said tunnel junction, said tunnel junction comprising the active magnetic tunneling region of said magnetic semiconductor located adjacent to one of said electrodes,
   means for producing a tunneling current through said tunnel junction, and
   means for sensing the change in tunnel resistance of said tunnel junction for detection of said magnetic bubble domain.

3. The sensor of claim 2, where said tunnel junction is formed between said magnetic semiconductor and at least one of said electrodes.

4. The sensor of claim 2, where at least one of said electrodes is a metal.

5. The sensor of claim 2, further including propagation means for moving said bubble domains in said magnetic medium.

6. The sensor of claim 2, where said magnetic semiconductor is comprised of materials selected from the group consisting essentially of doped EuS, doped EuO, and $CdCr_2Se$.

7. The sensor of claim 2, where said bubble domains have diameters less than about one micron.

8. A sensor for detection of magnetic bubble domains in a magnetic medium, said sensor comprising a conducting material and a magnetic semiconductor located in contact therewith, there being a tunnel junction formed between said conductor and said magnetic semiconductor whose tunneling resistance depends upon the presence and absence of a magnetic bubble domain sufficiently close to said tunnel junction that the stray magnetic field associated with said domain will intercept said tunnel junction.

* * * * *